（12） United States Patent
Foster et al.

(10) Patent No.: US 7,771,779 B2
(45) Date of Patent: Aug. 10, 2010

(54) PLANARIZED MICROELECTRONIC SUBSTRATES

(75) Inventors: Kenneth L. Foster, Midland, MI (US); Michael J. Radler, Midland, MI (US)

(73) Assignee: Dow Global Technologies Inc.

( * ) Notice: Subject to any disclaimer, the term of this patent is extended or adjusted under 35 U.S.C. 154(b) by 1316 days.

(21) Appl. No.: 10/494,240

(22) PCT Filed: Nov. 6, 2002

(86) PCT No.: PCT/US02/35756

§ 371 (c)(1), (2), (4) Date: May 3, 2004

(87) PCT Pub. No.: WO03/064495

PCT Pub. Date: Aug. 7, 2003

(65) Prior Publication Data

US 2004/0241338 A1    Dec. 2, 2004

Related U.S. Application Data

(60) Provisional application No. 60/338,054, filed on Nov. 7, 2001.

(51) Int. Cl.
*C23C 18/00*        (2006.01)
(52) U.S. Cl. ............... 427/99.3; 427/98.3; 257/752; 257/762; 438/625; 438/626; 438/627; 438/645; 438/756
(58) Field of Classification Search ............ 427/99.3, 427/98.3; 257/762, 752; 438/625–627, 645, 438/687, 752, 756; 526/281, 283, 285, 308, 526/396
See application file for complete search history.

(56) References Cited

U.S. PATENT DOCUMENTS 5,002,808 A * 3/1991 Hahn et al. ............. 427/387
(Continued)

FOREIGN PATENT DOCUMENTS

EP        1 085 529        3/2001
(Continued)

OTHER PUBLICATIONS

G.Maier, Materials Today, "Polymeris of Microelectronics", Sep./Oct. 2001, pp. 22-33.*
(Continued)

*Primary Examiner*—Nadine G Norton
*Assistant Examiner*—Maki A Angadi

(57) ABSTRACT

The instant invention is a process for planarizing a microelectronic substrate with a cross-linked polymer dielectric layer, comprising the steps of: (a) heating such a substrate coated with a layer comprising an uncured cross-linkable polymer and a glass transition suppression modifier to a temperature greater than the glass transition temperature of the layer, the temperature being less than the curing temperature of the uncured cross-linkable polymer to form a substrate coated with a heat flowed layer; and (b) heating the substrate coated with the heat flowed layer to a curing temperature of the uncured cross-linkable polymer of the heated layer to cure the uncured cross-linkable polymer to form a planarized substrate wherein the percent planarization at 100 micrometers is greater than fifty percent. The instant invention is a microelectronic device made using the above-described process. The instant invention is a composition of matter, comprising: an essentially solvent free composition comprising an uncured cross-linkable polymer and a glass transition suppression modifier, the composition having a glass transition temperature sufficiently less than the curing temperature of the uncured composition so that if the uncured composition is heated to a temperature above its glass transition temperature but below its curing temperature, the uncured composition will flow.

14 Claims, 3 Drawing Sheets

U.S. PATENT DOCUMENTS

| | | | |
|---|---|---|---|
| 5,446,204 A | 8/1995 | Bryant et al. | 568/333 |
| 5,965,679 A * | 10/1999 | Godschalx et al. | 526/281 |
| 6,600,229 B2 * | 7/2003 | Mukherjee et al. | 257/762 |

FOREIGN PATENT DOCUMENTS

| | | |
|---|---|---|
| WO | 00/31183 | 6/2000 |
| WO | 00/40637 | 7/2000 |
| WO | 01/38417 | 5/2001 |

OTHER PUBLICATIONS

P. Chiniwalla et al. IEEE Transactions on Advanced Packaging, vol. 24, No. 1, Feb. 2001, pp. 41-53.*

Steigerwald et al., *Chemical Mechanical Planarization of Microelectronic Materials*, Wiley Interscience, 1997.

Rothman, "Properties of Thin Polyimide Films", *Journal of the Electrochemical Society*, vol. 127, No. 10 (Oct. 1980).

Stokich, et al., "Planarization with Cyclotene™ 3022 (BCB) Polymer Coatings", *MRS Sym. Proc.*, vol. 308, pp. 517 (1993).

\* cited by examiner

PLANARIZED MICROELECTRONIC SUBSTRATES

This is a §371 application of PCT International Patent Application Number PCT/US2002/35756 filed Nov. 6, 2002, which claimed benefit from U.S. Provisional Patent Application No. 60/338,054, filed Nov. 7, 2001, each of which is incorporated herein by reference in its entirety.

This invention relates to a method of making planarized surfaces, particularly in microelectronics manufacture.

As discussed, for example, in U.S. Pat. No. 5,965,679 (herein fully incorporated by reference) polymer dielectrics may be used as insulating layers between various circuits and layers within circuits in microelectronic devices such as integrated circuits, multichip modules, laminated circuit boards and the like. As also discussed in the '679 Patent, such polymer dielectric layers also are desired to planarize the patterned surface of microelectronic substrates. As discussed in PCT Publication Nos. WO 00/31183 and WO 01/38417 A1, such layers can be made to be porous by adding various materials to the prepolymer composition of the polymer dielectric layer.

Despite the good degree of planarization obtained with known polymer dielectric materials for closely spaced circuit features (sometimes referred to as local planarization), the degree of planarization obtained with known polymer dielectric materials for such features as well as larger and widely spaced features (sometimes referred to as global planarization), for example, planarization of the region between the pads and the array, tends to be unacceptable.

As discussed by Steigerwald et al., in their book entitled "Chemical Mechanical Planarization of Microelectronic Materials" (Wiley Interscience 1997), an excellent solution to an unacceptable planarization of the dielectric layer is the use of chemical-mechanical polishing to planarize the dielectric layer. However, chemical-mechanical planarization of the dielectric layer of a microelectronic device is relatively expensive.

It would be an advance in the art of planarizing the dielectric layer of a microelectronic device if a composition and process were discovered that resulted in a self-planarized dielectric layer for such difficult to planarize circuit patterns.

The various embodiments of the instant invention provide a composition and process for a dielectric layer of a microelectronic device that is self-planarized even for such difficult to planarize circuit patterns. More specifically, the instant invention is a process for planarizing a microelectronic substrate with a cross-linked polymer dielectric layer, comprising the steps of: (a) heating such a substrate coated with a layer comprising an uncured cross-linkable polymer and a glass transition suppression modifier to a temperature greater than the glass transition temperature of the layer, the temperature being less than the curing temperature of the uncured cross-linkable polymer to form a substrate coated with a heat flowed layer; and (b) heating the substrate coated with the heat flowed layer to a curing temperature of the uncured cross-linkable polymer of the heated layer to cure the uncured cross-linkable polymer to form a planarized substrate wherein the percent planarization at 100 micrometers is greater than fifty percent. In a related embodiment, the instant invention is a microelectronic device made using the above-described process.

In another embodiment, the instant invention is a composition of matter, comprising: an essentially solvent free composition comprising an uncured cross-linkable polymer and a glass transition suppression modifier, the composition having a glass transition temperature sufficiently less than the curing temperature of the uncured composition so that if the uncured composition is heated to a temperature above its glass transition temperature but below its curing temperature, the uncured composition will flow. In a related embodiment, the instant invention is a microelectronic device made using the above-described composition.

Figure 4A:
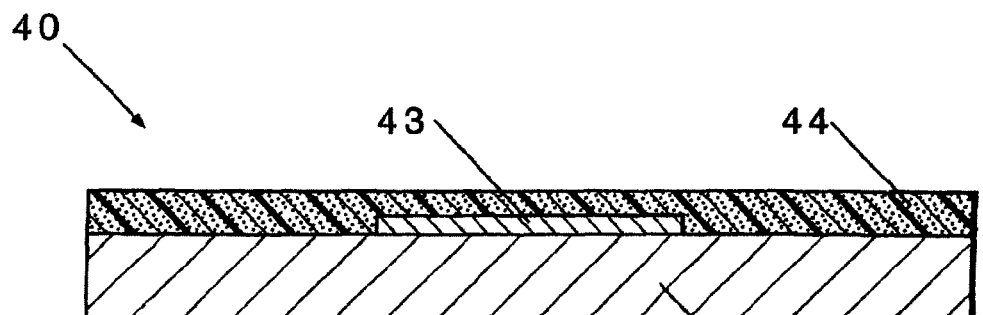
Figure 4B:
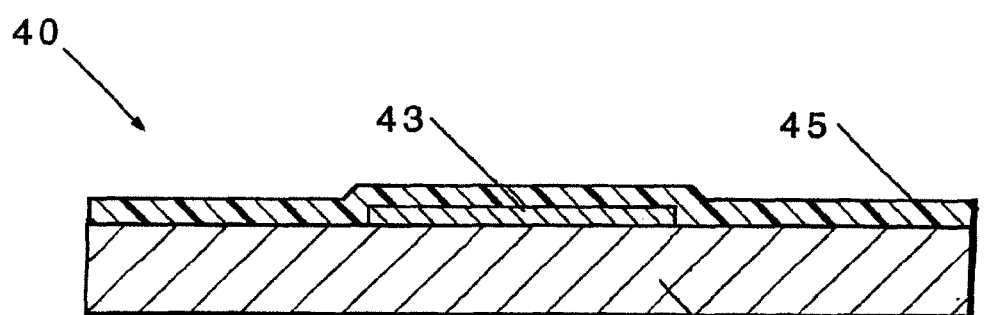
Figure 4C:
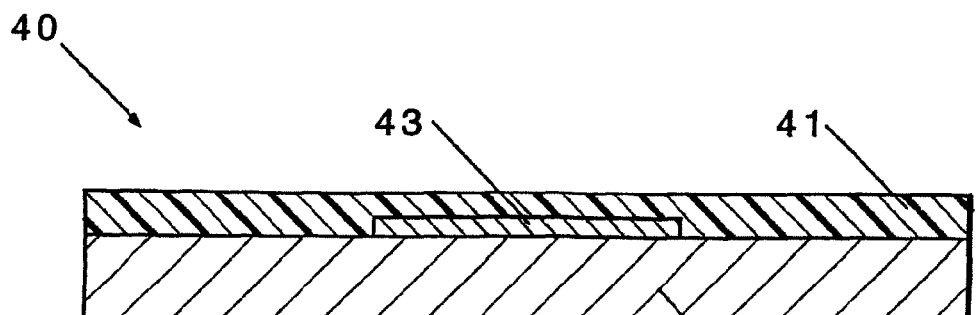
Figure 5:
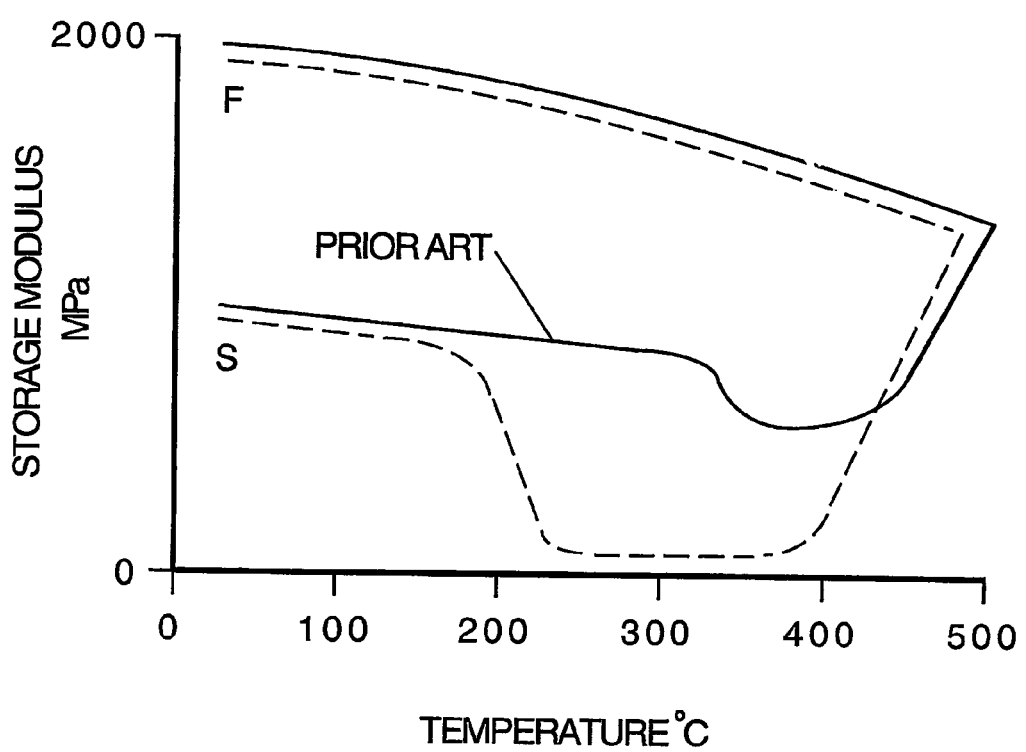

FIGS. 4a-c is a series of schematic cross-sectional side views of a partially completed microelectronic device planarized with a thermoset polymer dielectric layer according to a process embodiment of the instant invention; and FIG. 5 is a graph of storage modulus v. temperature for the curing cycle of a prior art thermoset polymer and a thermoset polymer of the instant invention.

Figure 1:
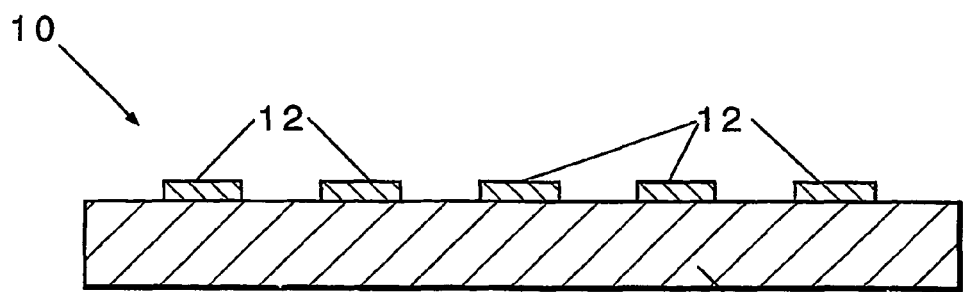
FIG. 1 is a schematic cross-sectional side view of a partially completed microelectronic device cross-sectioned perpendicular to its conductor lines.

Referring now to FIG. 1, therein is shown a schematic cross-sectional side view of a microelectronic device 10 showing substrate 11 cross-sectioned perpendicular to conductor lines 12 on the substrate 11.

Figure 2:
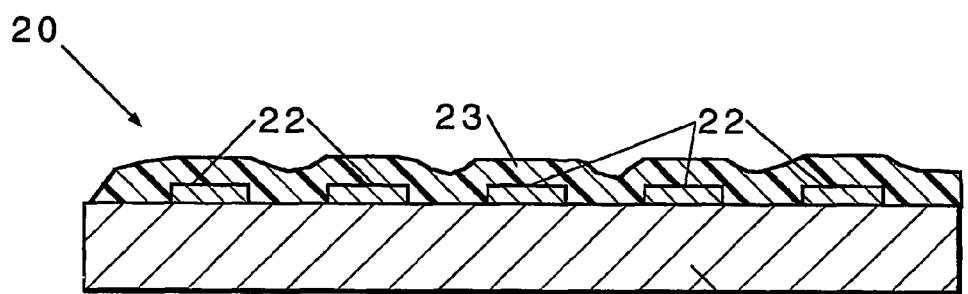
FIG. 2 is a schematic cross-sectional side view of a partially completed microelectronic device like that shown in FIG. 1, planarized with a thermoset polymer dielectric layer of the prior art.

Referring now to FIG. 2, therein is shown a schematic cross-sectional side view of a microelectronic device 20 showing substrate 21 cross-sectioned perpendicular to conductor lines 22 on the substrate 21, planarized with a thermoset polymer dielectric layer 23 of the prior art such as the thermoset polymer of U.S. Pat. No. 5,965,679. It should be noticed that the topography of the layer 23 is not level but dips between the conductor lines 22, which dips are exaggerated for clarity.

Figure 3:
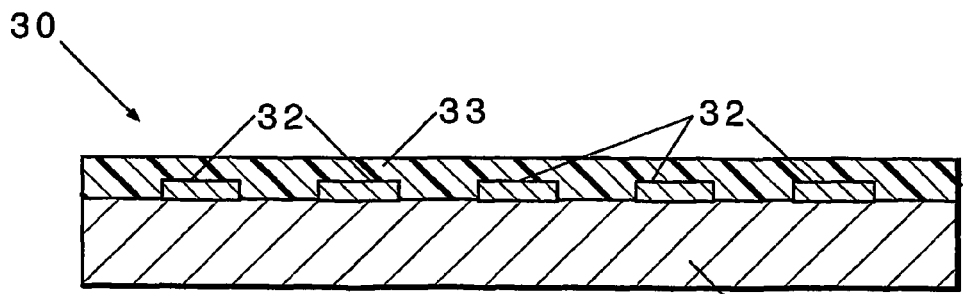
FIG. 3 is a schematic cross-sectional side view of a partially completed microelectronic device like that shown in FIG. 1, planarized with a thermoset polymer dielectric layer of the instant invention.

Referring now to FIG. 3, therein is shown a schematic cross-sectional side view of a microelectronic device 30 showing substrate 31 cross-sectioned perpendicular to conductor lines 32 on the substrate 31, planarized with a thermoset polymer dielectric layer 33 according to the instant invention. It should be noticed that the topography of the layer 33 is level and does not dip between the conductor lines 22, or at least the layer 33 is much more level than the layer 23 of FIG. 2.

The term "percent planarization at 100 micrometers" is defined herein as: the dielectric layer cross-sectional thickness from a flat substrate at a point about 100 micrometers perpendicular from the longitudinal center line of a 100 micrometer wide, 1 micrometer thick line shaped feature on the substrate; divided by the dielectric layer cross-sectional thickness from the substrate at a point about on the center line of the feature; wherein the dielectric layer cross-sectional thickness from the substrate at the point about 100 micrometers from the center line of the feature is about two micrometers.

Referring now to FIGS. 4a-c, therein is shown a series of schematic cross-sectional side views of a microelectronic device 40 planarized with a thermoset polymer dielectric layer 41 according to a process embodiment of the instant invention. The device 40 is shown having a substrate 42 and a feature 43 on the substrate 42. The feature 43 is a line 100 micrometers wide and 1 micrometer thick. The layer 41 is two micrometers thick from the substrate 42. The feature 43 is shown cross-sectioned perpendicular to its longitudinal centerline.

Referring now to FIG. 4a, a dispersion 44 of a thermoset polymer dielectric prepolymer in a solvent has been coated onto the substrate 42. The topography of the dispersion 44 is level. Such leveling is believed to be caused primarily by the surface tension and viscosity of the dispersion 44.

Referring now to FIG. 4b, the solvent of the dispersion 44 of FIG. 4a is evaporated so that the substrate 42 is coated with a layer 45 of uncured polymer. The topography of the layer 45 is not level because the evaporation of the solvent causes the layer 45 to "dry down" and conform somewhat to the underlying topography of the substrate 42 and feature 43.

Referring now to FIG. 4c, the substrate 42 of FIG. 4b has been heated to cure the uncured thermoset polymer of the layer 45 of FIG. 4b to form the planarized thermoset polymer dielectric layer 41. The percent planarization at 100 micrometers of layer 41 must me greater than fifty percent, preferably greater than sixty-five percent and more preferably greater than eighty percent but most preferably greater than ninety percent. The cross-linked polymer of the layer 41 can be organic, that is, a polymer having a carbon based backbone, or inorganic, that is, a polymer having a silicon based backbone.

Referring now to FIG. 5, therein is shown a graph of storage modulus v. temperature for the curing cycle of a prior art thermoset polymer (solid line representing the polymer of EXAMPLE 5 of U.S. Pat. No. 5,965,679) and a thermoset polymer of the instant invention (dashed line). The curing cycle for the prior art thermoset polymer starts at S as a prepolymer composition and assumes that any solvent used to facilitate a coating of the prepolymer has been essentially evaporated from the composition. As the prior art prepolymer composition is heated, its storage modulus decreases somewhat to about 300 degrees C., then dips but rises between 400 degrees C. and 500 degrees C. as the prepolymer cures to form the polymer. Cooling the polymer to point F completes the curing cycle.

Referring still to FIG. 5, the curing cycle for a thermoset polymer embodiment of the instant (dashed line) starts at S as a prepolymer composition and assumes that any solvent used to facilitate a coating of the prepolymer has been essentially evaporated from the composition. As the composition of the instant invention is heated, its storage modulus decreases somewhat to about 150 degrees C., then dips to a relatively low level between 250 degrees C. and 400 degrees C. and then rises between 400 degrees C. and 500 degrees C. as the prepolymer cures to form the polymer. Cooling the polymer to point F completes the curing cycle.

Referring still to FIG. 5, it will be noticed that an important difference between the cure cycle of the prior art polymer and the polymer of the instant invention is that the storage modulus of the polymer of the instant invention is zero or near zero or at least sufficiently low during the cure cycle to allow the uncured layer 45 of FIG. 4b to flow and self-level to the layer 41 of FIG. 4c. The prior art polymer does not self-level to the same extent as the polymer of the instant invention because the storage modulus of the prior art polymer during its cure cycle does not fall to a level that permits such a degree of flow and self-leveling.

The specific cross-linkable polymer used the instant invention is not critical. Preferably, the cross-linkable polymer is a thermoset polymer but the cross-linking can be initiated by other means such as radiation or chemical reactions, for example, UV light or peroxide decomposition. The polymer may be organic or inorganic. Examples of suitable organic cross-linkable polymers include particularly those cross-linkable polymers useful in microelectronics manufacture, such as polyimides, benzocyclobutene based polymers, polyarylenes (including polyarylene ethers), and the like. Polyarylene polymers are preferred for many microelectronics applications due to their excellent thermal stability. Polyarylene polymers comprising diene and dienophile reactive groups are particularly preferred. Cyclopentadienone groups are particularly useful as the diene group. Acetylene groups are particularly useful as the diene group.

Such cross-linkable polyarylenes may be made for example by reacting (for example through heating monomeric compounds having reactive groups selected from diene groups and dienophile groups, wherein at least some of the monomeric compounds have at least three such reactive groups. One preferred cross-linkable polymer useful in the instant invention comprises the reaction product of one or more polyfunctional compounds containing two or more cyclopentadieneone groups and at least one polyfunctional compound containing two or more aromatic acetylene groups wherein at least one of the polyfunctional compounds contain three or more groups selected from the group consisting of acetylene groups and cyclopentadienone groups as disclosed in U.S. Pat. No. 5,965,679.

Example of suitable inorganic cross-linkable polymers include polysilanes such as a polysilesquioxane, for example, polyvinylsilesquioxane or polyphenylsilesquioxne.

The specific glass transition suppression modifier used in the instant invention is not critical provided the modifier does not have a significant negative effect on the physical, mechanical or electrical properties of the cured film. As will be discussed below in greater detail, a polymer or oligomer or monomer is often preferred. However, a person of ordinary skill in the art readily understands that a vast multitude of other materials, can be used depending specific cross-linkable polymer/oligomer system.

According to one embodiment, the composition comprises a cross-linkable polymer (for example, the reaction product of one or more polyfunctional compounds containing two or more cyclopentadieneone groups and at least one polyfunctional compound containing two or more aromatic acetylene groups wherein at least one of the polyfunctional compounds contain three or more groups selected from the group consisting of acetylene groups and cyclopentadienone groups as disclosed in U.S. Pat. No. 5,965,679) and a glass transition suppression polymer. The addition of the glass transition suppression polymer suppresses the glass transition temperature of the composition so that the storage modulus of the composition will decrease sufficiently to allow self-planarization during the curing cycle before the composition completes its polymerization.

The specific polymer used as the glass transition suppression agent is not critical in the instant invention. However, the glass transition suppression polymer is preferably miscible with the cross-linkable polymer. Such miscibility is, of course, primarily a function of the molecular weight and solubility parameter characteristics of the glass transition suppression polymer. Thus, a glass transition suppression polymer having a relatively low molecular weight is generally preferred, for example, a number average molecular weight less than 10,000 or even less than 5,000.

Polymers that are believed to be useful for use as the glass transition suppression polymer include polystyrenes, polyoxylenes, polydimethylphenylene oxides, polyethylene-glycol-terephthalate, aromatic polyimides and polysulfones. Non-aromatic based polymers that are believed to be useful for use as the glass transition suppression polymer include polyethylene, polypropylene, polyisobutylene, polyacrylonitrile, polyacrylates, and polymethylmethacrylates. Selection of the optimal glass transition suppression polymer is based in part upon compatibility of the glass transition suppression polymer and the cross-linkable polymer.

Polystyrene of a number average molecular weight between 300 and 50,000 is a preferred glass transition polymer for use with highly aromatic cross-linkable polymers such as polyarylenes. When using a narrow molecular weight range polystyrene, then preferably the number average molecular weight of such polystyrene is less than about 7,000 and greater than about 300.

An end-capped linear polyarylene or polyarylene ether oligomers (ECO), that is, a linear polyarylene and/or polyphenylene and/or polyarylene ether oligomer having terminal groups that will not further polymerize, is also a preferred glass transition polymer. Preferably, the number average molecular weight of an ECO is between about 300 and 8,000. More preferably, the number average molecular weight of an ECO is between about 1,000 and 3,000.

The amount of glass transition suppression polymer (expressed as the weight percent of the total amount of oligomer/polymer) used must be sufficient to provide a "window" of temperature in the cure cycle where the storage modulus is sufficiently low to allow the required self-planarization. Generally, the amount of glass transition suppression polymer should be less than fifty weight percent based on the weight of solids, more preferably less than forty weight percent, more preferably still less than 30 weight percent and most preferably less than 20 percent. Preferably, the amount is more than 1 percent, more preferably more than 5 percent more preferably still more than 10 percent. For example, seven percent polystyrene added to the prepolymer of the '679 Patent may not be sufficient while thirty-five percent is highly preferred with fifty percent being perhaps a bit too much.

Preferably, the glass transition suppression polymer decomposes and/or vaporizes from the thermoset polymer as it cures so that little or no glass transition suppression polymer remains in the cured thermoset polymer. For example, polystyrene vaporizes from the prepolymer of the '679 Patent at the higher temperature ranges of its cure cycle. Preferably, removal to the glass transition suppression polymer does not cause formation of pores or substantial collapse or volume loss of the film.

However, the glass transition suppression polymer is not required to decompose and/or vaporize from the thermoset polymer as it cures. For example, when an ECO is used as the glass transition suppression polymer, the ECO preferably remains in the cured thermoset polymer.

Another preferred composition of the instant invention comprises a cross-linkable polymer (for example the reaction product of one or more polyfunctional compounds containing two or more cyclopentadieneone groups and at least one polyfunctional compound containing two or more aromatic acetylene groups wherein at least one of the polyfunctional compounds contain three or more groups selected from the group consisting of acetylene groups and cyclopentadienone groups as disclosed in U.S. Pat. No. 5,965,679) and a glass transition suppression monomer. Any of the monomers that can react with the reactive groups on the cross-linkable polymer (such as for example, the monomers of the '679 Patent) can, in theory, be used as a glass transition suppression monomer. Thus, monomers having diene or dienophile groups (preferably at least two diene or dienophile groups) are useful with polymers having diene or dienophile reactive groups. One preferred glass transition suppression monomer is 1,3, 5-tris(phenylethynyl)benzene because the solubility characteristics of this monomer.

The amount of glass transition suppression monomer used in the instant invention is determined by that amount that is required to achieve the required percent planarization. Such amount of monomer may optionally be withheld from the preparation of the oligomer or prepolymer composition so that the final cured polymer stoichiometry is maintained. The amount of glass transition suppression monomer may preferably be at least 1 percent by weight based on weight of monomer and prepolymer, more preferably at least 5 percent most preferably at least 10 percent. The amount is preferably less than 50 percent, more preferably less than 40 percent, most preferably less than 30 percent.

Preferred glass transition suppression modifiers for use with such polysilesquioxanes include polydimethylsilanes, polycyclohexylmethylsilanes, polyphenylmethylsilanes, polymethylsilsesquioxanes and, of course, various co-polymers of the above-mentioned polysilanes. Although it is preferable to use a silane type glass transition suppression modifier with a polysilane cross linkable polymer of the instant invention, such use is not required herein.

According to one preferred embodiment the composition of cross-linkable polymer and glass transition temperature suppression modifier are coated on a substrate from a solvent. Suitable solvents for the organic cross-linkable polymer compositions include, but are not limited to mesitylene, pyridine, triethylarnine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof Typically, the solvent used to prepare a spin coating composition of such polysilesquioxanes is methylisobutyl ketone.

The instant invention, in another embodiment, is a microelectronic device made by any of the above-described processes. The instant invention, in yet another embodiment, is a microelectronic device comprising any of the above-described compositions.

The term "percent planarization at 1000 micrometers" is defined herein as: the dielectric layer cross-sectional thickness from a flat substrate at a point about 1000 micrometers perpendicular from the longitudinal center line of a 1000 micrometer wide, 1 micrometer thick line shaped feature on the substrate; divided by the dielectric layer cross-sectional thickness from the substrate at a point about on the center line of the feature; wherein the dielectric layer cross-sectional thickness from the substrate at the point about 1000 micrometers from the center line of the feature is about two micrometers. The percent planarization at 1000 micrometers obtainable with the instant invention can be better than fifty percent, preferably better than sixty-five percent, more preferably better than eighty percent and most preferably better than ninety percent.

EXAMPLE 1

Example 5 of U.S. Pat. No. 5,965,679 is repeated except that the N-methylprrolidinone is replaced with gama butyl lactone to produce a "mixture A" containing about 40% oligomer and 60% N-methylprrolidinone. Mesitylene is added to mixture A to produce "mixture B" containing about 30% oligomer, about 45% gama butyl lactone and about 25% mesitylene. 45.33 grams of "mixture B", 4.00 grams of 1,3, 5-tris(phenylethynyl)benzene, 20.80 grams of gama butyl lactone and 29.87 grams of mesitylene are mixed to form "mixture C".

EXAMPLE 2

45.33 grams of "mixture B" of EXAMPLE 1 above, 8.00 grams of 1,3,5-tris(phenylethynyl)benzene, 18.80 grams of gama butyl lactone and 27.87 grams of mesitylene are mixed to form "mixture D".

EXAMPLE 3

45.33 grams of "mixture B" of EXAMPLE 1 above, 3.00 grams of polystyrene (1,300 number average molecular weight), 21.30 grams of gama butyl lactone and 30.37 grams of mesitylene are mixed to form "mixture E"

EXAMPLE 4

45.33 grams of "mixture B" of EXAMPLE 1 above, 5.00 grams of polystyrene (1,300 number average molecular weight), 20.30 grams of gama butyl lactone and 29.37 grams of mesitylene are mixed to form "mixture F".

EXAMPLE 5

Partially completed microelectronic devices on 200-millimeter diameter silicon wafers C, D, E and F are planarized using mixture C, D, E and F respectively. Each silicon wafer C, D, E and F is essentially identical and each has 100 micrometer wide, 1 micrometer thick isolated line features on the surface of the wafer as well as 1000 micrometer wide, 1 micrometer thick isolated line features on the surface of the wafer.

3 milliliters of adhesion promoter AP4000 from The Dow Chemical Company is applied to each silicon wafer C, D, E and F while each wafer is spun slowly to spread the adhesion promoter across the surface of each wafer, allowed to stand for 2 seconds, then spun at 3,000 rpm for 10 seconds, and then heated to 185 degrees C. for 90 seconds to produce adhesion promoter treated wafers C, D, E and F.

6 milliliter of filtered mixture C, D, E and F are applied to adhesion promoter treated wafers C, D, E and F respectively as each wafer is spun at 750 rpm. Then each wafer is spun at 2,000 rpm for 20 seconds, heated on a hot plate at 150 degrees C. for 20 seconds to evaporate the solvent from the uncured polymer film on each wafer. After edge bead removal, each wafer is heated to 320 degrees C. under nitrogen for 4 minutes to heat flow the uncured polymer film on each wafer. Then, each wafer is heated to 450 degrees C. under nitrogen for 2 minutes to cure the polymer film on each wafer. The percent planarization at 100 micrometers of each wafer is greater than 90%.

COMPARATIVE EXAMPLE 1

50.00 grams of "mixture B", 20.00 grams of gama butyl lactone and 30.00 grams of mesitylene are mixed to form "mixture G". Partially completed microelectronic devices on 200-millimeter diameter silicon wafer G (which wafer is essentially identical to wafers C, D, E and F) is planarized using mixture G.

3 milliliters of adhesion promoter AP4000 from The Dow Chemical Company is applied to silicon wafer G while it is spun slowly to spread the adhesion promoter across the surface of the wafer, allowed to stand for 2 seconds, then spun at 3,000 rpm for 10 seconds, and then heated to 185 degrees C. for 90 seconds to produce adhesion promoter treated wafer G.

6 milliliters of filtered mixture G is applied to adhesion promoter treated wafer G as it is spun at 750 rpm. Then the wafer is spun at 2,000 rpm for 20 seconds, heated on a hot plate at 150 degrees C. for 20 seconds to evaporate the solvent from the uncured polymer film on the wafer. After edge bead removal, the wafer is heated to 320 degrees C. under nitrogen for 4 minutes to heat the uncured polymer film on the wafer. Then, each wafer is heated to 450 degrees C. under nitrogen for 2 minutes to cure the polymer film on the wafer. The percent planarization at 100 micrometers of the wafer is less than 20%. The percent planarization at 1000 micrometers of the wafer is less than 10%.

COMPARATIVE EXAMPLE 2

Planarized silicon wafer G of COMPARATIVE EXAMPLE 1 is subjected to Chemical Mechanical Polishing (CMP). The percent planarization at 100 micrometers of wafer G after CMP is greater than 90%. The percent planarization at 1000 micrometers of wafer G after CMP is greater than 90%.

EXAMPLE 6

20 grams of polyphenylsilesquioxane, 2 grams of polyhexylsilane and 78 grams of methylisobutyl ketone are mixed to form "mixture S". 6 milliliters of filtered mixture S is applied to an adhesion promoter treated wafer as it is spun at 750 rpm. Then the wafer is spun at 2,000 rpm for 20 seconds, heated on a hot plate at 150 degrees C. for 20 seconds to evaporate the solvent from the uncured polymer film on the wafer.

What is claimed is:

1. A process for planarizing a microelectronic substrate with a cross-linked polymer dielectric layer, comprising the steps of: (a) coating the substrate with a composition comprising a solvent, an uncured cross-linkable polymer and a glass transition suppression modifier to form a substrate coated with the composition, wherein the uncured, cross-linkable polymer is the reaction product of cyclopentadienone and acetylene functional compounds wherein at least some of such compounds have three or more reactive groups and wherein the glass transition suppression modifier is a polymer which is substantially removed during the curing step or a monomer which reacts with the cross-linkable polymer; (b) evaporating the solvent from the composition to form the substrate coated with a layer comprising the uncured polymer and the glass transition suppression modifier, (c) heating the substrate coated with a layer comprising the uncured cross-linkable polymer and the glass transition suppression modifier to a temperature greater than the glass transition temperature of the layer, the temperature being less than the curing temperature of the uncured cross-linkable polymer to form a substrate coated with a heat flowed layer; and (d) heating the substrate coated with the heat flowed layer to a curing temperature of the uncured cross-linkable polymer of the heated layer to cure the uncured cross-linkable polymer to form a planarized substrate wherein the percent planarization at 100 micrometers is greater than fifty percent.

2. The process of claim 1, wherein the percent planarization at 100 micrometers is greater than sixty-five percent.

3. The process of claim 1, wherein the percent planarization at 100 micrometers is greater than eighty percent.

4. The process of claim 1, wherein the percent planarization at 100 micrometers is greater than ninety percent.

5. The process of claim 1 wherein the cross-linkable polymer is polyarylene and the glass transition suppression modifier is a low molecular weight polystyrene.

6. The process of claim 1, wherein the cross-linkable polymer comprises the reaction product of one or more polyfunctional compounds containing two or more cyclopentadieneone groups and at least one polyfunctional compound containing two or more aromatic acetylene groups wherein at least one of the polyfunctional compounds contain three or more groups selected from the group consisting of acetylene groups and cyclopentadienone groups and wherein the glass transition suppression modifier comprises a polymer.

7. The process of claim 1 wherein the glass transition suppression modifier is a polymer which wherein vaporizes from the cross-linkable polymer dielectric layer during the heating step.

8. The process of claim 1, wherein the cross-linkable polymer comprises the reaction product of one or more polyfunctional compounds containing two or more cyclopentadieneone groups and at least one polyfunctional compound containing two or more aromatic acetylene groups wherein at least one of the polyfunctional compounds contain three or more groups selected from the group consisting of acetylene groups and cyclopentadienone groups and wherein the glass transition suppression modifier comprises a monomer of the cross-linkable polymer.

9. The process of claim 8, wherein the monomer is 1,3,5-Tris(phenylethynyl)benzene.

10. The process of claim 1, wherein the glass transition suppression modifier is a glass transition suppression polymer is present in amount from 1 percent to 50 percent based on total weight of solids.

11. The process of claim 10, wherein the glass transition suppression polymer is present in amount from 5 percent to 40 percent based on total weight of solids.

12. The process of claim 1, wherein the glass transition suppression modifier is a monomer is present in an amount from 1 percent to 50 percent based on weight of monomer and cross-linkable polymer.

13. The process of claim 12, wherein the glass transition suppression monomer is present in an amount from 5 percent to 40 percent based on weight of monomer and cross-linkable polymer.

14. A microelectronic device made by a process comprising the process of claims 1.

* * * * *